(12) United States Patent
Reynolds

(10) Patent No.: US 7,990,160 B2
(45) Date of Patent: Aug. 2, 2011

(54) CAPACITIVE SENSING WITH COMBINATORIAL SENSOR LAYOUT

(75) Inventor: Joseph K Reynolds, Mountain View, CA (US)

(73) Assignee: Synaptics Incorporated, Santa Clara, CA (US)

( * ) Notice: Subject to any disclaimer, the term of this patent is extended or adjusted under 35 U.S.C. 154(b) by 273 days.

(21) Appl. No.: 12/471,206

(22) Filed: May 22, 2009

(65) Prior Publication Data

US 2010/0295564 A1    Nov. 25, 2010

(51) Int. Cl.
*G01R 27/26* (2006.01)
(52) U.S. Cl. .......................... 324/686; 324/658
(58) Field of Classification Search .................. None
See application file for complete search history.

(56) References Cited

U.S. PATENT DOCUMENTS

| | | |
|---|---|---|
| 4,016,490 A | 4/1977 | Weckenmann et al. |
| 6,642,857 B1 | 11/2003 | Schediwy et al. |
| 7,253,643 B1 * | 8/2007 | Seguine .............. 324/686 |
| 7,256,714 B2 | 8/2007 | Philipp |
| 7,323,885 B2 | 1/2008 | Gutendorf |
| 2002/0122131 A1 | 9/2002 | Sergio et al. |
| 2004/0252109 A1 | 12/2004 | Trent, Jr. et al. |
| 2005/0162408 A1 | 7/2005 | Martchovsky |
| 2006/0032680 A1 | 2/2006 | Elias et al. |
| 2006/0119369 A1 | 6/2006 | Kawahata et al. |
| 2007/0074913 A1 | 4/2007 | Geaghan et al. |
| 2007/0164756 A1 | 7/2007 | Lee |
| 2008/0006454 A1 | 1/2008 | Hotelling |
| 2009/0084611 A1 | 4/2009 | Liao et al. |

OTHER PUBLICATIONS

ISA/KR, International Search Report and Written Opinion for International Application No. PCT/US2010/031501, 8 pages, Nov. 1, 2010.
Santaolalla, Gustavo "Key-reading circuit saves I/O pins", www.edn.com, (Mar. 6, 2003),117-120.

* cited by examiner

*Primary Examiner* — Minh N Tang

(57) ABSTRACT

In a method for determining capacitance, a set of sensor electrodes is employed. The set of sensor electrodes comprises at least three sensor electrodes including first, second, and third sensor electrodes. The first sensor electrode meets the second sensor electrode at a first activation region of a plurality of activation regions. The first sensor electrode meets the third sensor at a second activation region of the plurality of activation regions. The second sensor electrode meets the third sensor electrode at a third activation region of the plurality of activation regions. The third sensor electrode transmits while first indicia are received with the first and the second sensor electrodes. The first sensor electrode transmits while second indicia are received with the second sensor electrode. Capacitances associated with the first, second and third activation regions are determined using at least the first indicia and second indicia.

23 Claims, 9 Drawing Sheets

| | 1 | 2 | | | 213 | | 216 | |
|---|---|---|---|---|---|---|---|---|
| 2 | 01,02 | 09,10 | 09,11 | 09,12 | 09,13 | 09,14 | 09,15 | 09,16 |
| 3 | 01,03 | 02,03 | 10,11 | 10,12 | 10,13 | 10,14 | 10,15 | 10,16 |
| 4 | 01,04 | 02,04 | 03,04 | 11,13 | 11,13 | 11,14 | 11,15 | 11,16 |
| 5 | 01,05 | 02,05 | 03,05 | 04,05 | 12,13 | 12,14 | 12,15 | 12,16 |
| 6 | 01,06 | 02,06 | 03,06 | 04,06 | 05,06 | 13,14 | 13,15 | 13,16 |
| 7 | 01,07 | 02,07 | 03,07 | 04,07 | 05,07 | 06,07 | 14,15 | 14,16 |
| 8 | 01,08 | 02,08 | 03,08 | 04,08 | 05,08 | 06,08 | 07,08 | 15,16 |
| 15 | 01,15 | 02,15 | 03,15 | 04,15 | 05,15 | 06,15 | 07,15 | 08,15 |
| 14 | 01,14 | 02,14 | 03,14 | 04,14 | 05,14 | 06,14 | 07,14 | 08,14 |
| 13 | 01,13 | 02,13 | 03,13 | 04,13 | 05,13 | 06,13 | 07,13 | 08,13 |
| 12 | 01,12 | 02,12 | 03,12 | 04,12 | 05,12 | 06,12 | 07,12 | 08,12 |
| 11 | 01,11 | 02,11 | 03,11 | 04,11 | 05,11 | 06,11 | 07,11 | 08,11 |
| 10 | 01,10 | 02,10 | 03,10 | 04,10 | 05,10 | 06,10 | 07,10 | 08,10 |
| 9 | 01,09 | 02,09 | 03,09 | 04,09 | 05,09 | 06,09 | 07,09 | 08,09 |
| 16 | 01,16 | 02,16 | 03,16 | 04,16 | 05,16 | 06,16 | 07,16 | 08,16 |

EMPLOYING A SET OF SENSOR ELECTRODES, THE SET OF SENSOR ELECTRODES COMPRISING AT LEAST THREE SENSOR ELECTRODES, WHEREIN A FIRST SENSOR ELECTRODE OF THE SET OF SENSOR ELECTRODES MEETS A SECOND SENSOR ELECTRODE OF THE SET OF SENSOR ELECTRODES AT A FIRST ACTIVATION REGION OF A PLURALITY OF ACTIVATION REGIONS, WHEREIN THE FIRST SENSOR ELECTRODE MEETS A THIRD SENSOR ELECTRODE OF THE SET OF SENSOR ELECTRODES AT A SECOND ACTIVATION REGION OF THE PLURALITY OF ACTIVATION REGIONS, AND WHEREIN THE SECOND SENSOR ELECTRODE MEETS THE THIRD SENSOR ELECTRODE AT A THIRD ACTIVATION REGION OF THE PLURALITY OF ACTIVATION REGIONS.
410

↓

TRANSMITTING WITH THE THIRD SENSOR ELECTRODE WHILE RECEIVING FIRST INDICIA WITH THE FIRST AND THE SECOND SENSOR ELECTRODES.
420

↓

TRANSMITTING WITH THE FIRST SENSOR ELECTRODE WHILE RECEIVING SECOND INDICIA WITH THE SECOND SENSOR ELECTRODE.
430

↓

DETERMINING CAPACITANCES ASSOCIATED WITH THE FIRST, THE SECOND AND THE THIRD ACTIVATION REGIONS USING AT LEAST THE FIRST INDICIA AND THE SECOND INDICIA.
440

PROVIDING A SET OF SENSOR ELECTRODES, THE SET OF SENSOR ELECTRODES COMPRISING AT LEAST THREE SENSOR ELECTRODES, WHEREIN A FIRST SENSOR ELECTRODE OF THE SET OF SENSOR ELECTRODES MEETS A SECOND SENSOR ELECTRODE OF THE SET OF SENSOR ELECTRODES AT A FIRST ACTIVATION REGION OF A PLURALITY OF ACTIVATION REGIONS, WHEREIN THE FIRST SENSOR ELECTRODE MEETS A THIRD SENSOR ELECTRODE OF THE SET OF SENSOR ELECTRODES AT A SECOND ACTIVATION REGION OF THE PLURALITY OF ACTIVATION REGIONS, AND WHEREIN THE SECOND SENSOR ELECTRODE MEETS THE THIRD SENSOR ELECTRODE AT A THIRD ACTIVATION REGION OF THE PLURALITY OF ACTIVATION REGIONS.
510

↓

PROVIDING A PLURALITY OF SENSOR CHANNELS.
520

↓

OHMICALLY COUPLING A FIRST SENSOR CHANNEL OF THE PLURALITY OF SENSOR CHANNELS TO THE FIRST SENSOR ELECTRODE.
530

↓

OHMICALLY COUPLING A SECOND SENSOR CHANNEL OF THE PLURALITY OF SENSOR CHANNELS TO THE SECOND SENSOR ELECTRODE.
540

↓

OHMICALLY COUPLING A THIRD SENSOR CHANNEL OF THE PLURALITY OF SENSOR CHANNELS TO THE THIRD SENSOR ELECTRODE, WHEREIN THE FIRST SENSOR CHANNEL IS CONFIGURED TO BOTH TRANSMIT AND RECEIVE ELECTRICAL SIGNALS, WHEREIN FIRST INDICIA FOR SENSING CAPACITANCES ASSOCIATED WITH THE PLURALITY OF ACTIVATION REGIONS IS RECEIVED WITH THE FIRST AND SECOND SENSOR CHANNELS WHILE THE THIRD SENSOR CHANNEL TRANSMITS AND WHEREIN SECOND INDICIA FOR SENSING CAPACITANCES ASSOCIATED WITH THE PLURALITY OF ACTIVATION REGIONS IS RECEIVED WITH THE SECOND SENSOR CHANNEL WHILE THE FIRST SENSOR CHANNEL TRANSMITS.
550

FIG. 5

CAPACITIVE SENSING WITH COMBINATORIAL SENSOR LAYOUT

BACKGROUND

Capacitive sensing devices, otherwise known as touch sensing devices or proximity sensors are widely used in modern electronic devices. A capacitive sensing device is often used for touch based navigation, selection, or other input, in response to a finger, stylus, or other object being placed on or in proximity to a sensor of the capacitive sensing device. In such a capacity, capacitive sensing devices are often employed in computers (e.g. notebook/laptop computers), media players, multi-media devices, remote controls, personal digital assistants, smart devices, telephones, and the like. Such capacitive sensing devices are often operated, at least in part, by a controller component such as an application specific integrated circuit (ASIC). The inputs and/or outputs of the controller component are typically used to drive the portions of the sensing devices and to measure capacitance(s) from the sensing devices. The measurement may include multiple inputs and/or outputs (e.g. receivers, transmitters and guards, etc.). In one embodiment the inputs/outputs of the controller may be configured at different times to measure different capacitances from the sensing device.

BRIEF DESCRIPTION OF THE DRAWINGS

The accompanying drawings, which are incorporated in and form a part of the Description of Embodiments, illustrate various embodiments of the present invention and, together with the Description of Embodiments, serve to explain principles discussed below. The drawings referred to in this Brief Description of Drawings should not be understood as being drawn to scale unless specifically noted.

FIG. 2A is a block diagram of an example layout of a capacitive sensor array, according to an embodiment.

FIG. 4 is a flow diagram of a method for determining capacitance, according to an embodiment.

FIG. 5 is a flow diagram of a method for providing a capacitance sensing device, according to an embodiment.

DESCRIPTION OF EMBODIMENTS

Figure 1A:
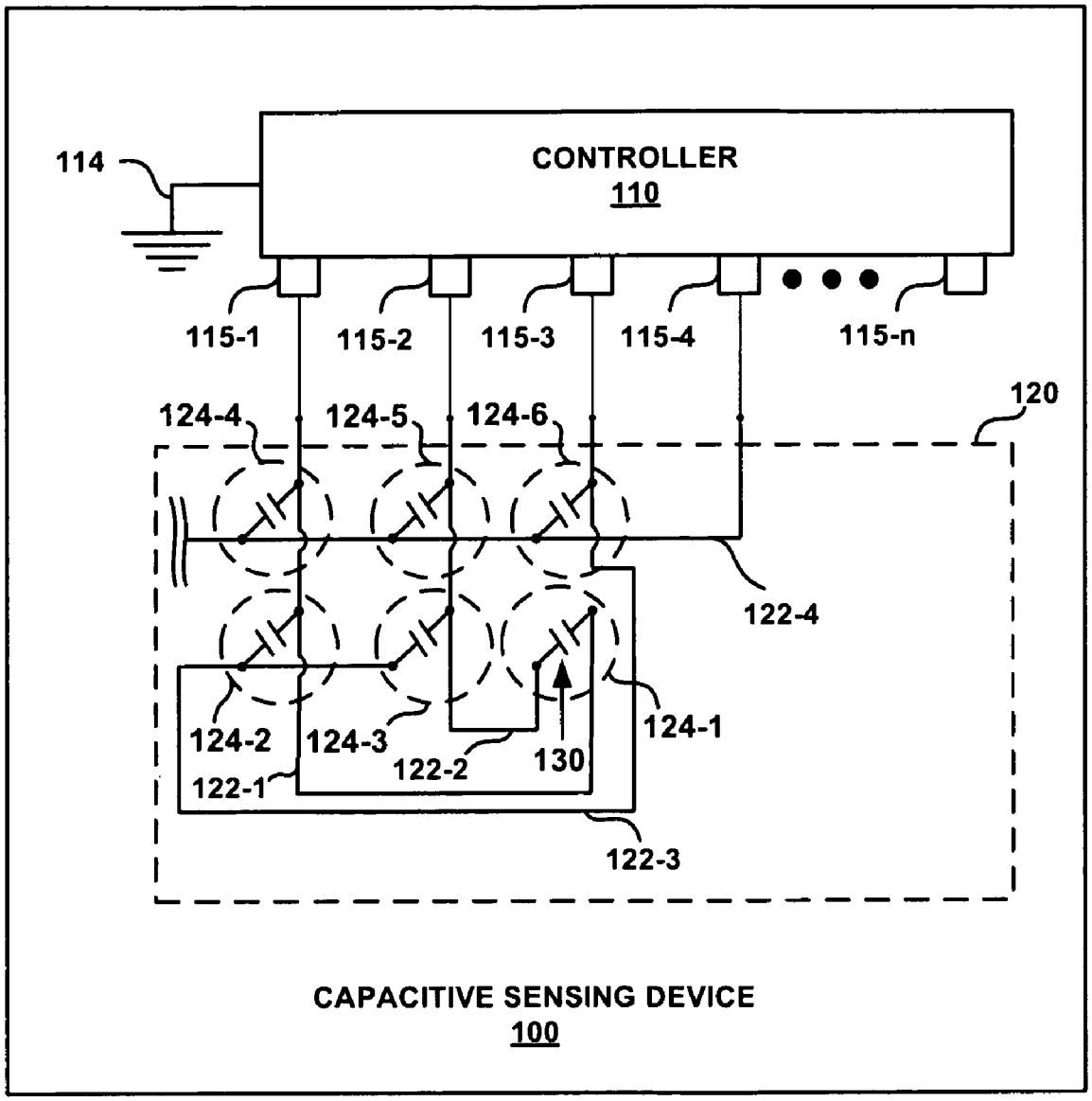
FIG. 1A is a diagram of an example capacitive sensing device, according to an embodiment.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in the following Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Unless specifically stated otherwise as apparent from the following discussions, it is appreciated that throughout the present Description of Embodiments, discussions utilizing terms such as "transmitting," "determining", "receiving" or the like, often refer to the actions and processes of a controller (such as controller 110 of FIG. 1A), or similar electronic computing device. The controller or similar electronic computing device transmits, receives, manipulates and transforms data represented as physical (electronic) quantities within the controller's circuits, components, logic, memories, and the like, into other data similarly represented as physical quantities within the controller or within other information/signal storage, transmission, manipulation, or display devices.

Overview of Discussion

Conventional capacitive sensing devices typically utilize controllers that only transmit or receive information on an input/output (I/O) sensor channel, and as such, the capacitive sensor arrays in these conventional capacitance sensing devices are configured such that individual sensor electrodes in the capacitive sensor array of the conventional capacitance sensing device are used for either transmitting or receiving, but not for both.

Herein, a capacitive sensing device with a combinatorial sensor layout is described. As will be described, such a layout is designed such that one or more of at least three sensors on a controller are used for both transmitting and receiving when determining a capacitance within a capacitive sensing device in which the controller is used. As compared to conventional capacitive sensing devices, this allows for: increasing the number of capacitive sensing measurements within a capacitive sensor (e.g. allowing increased capacitive sensor pixel density) without increasing the number of sensor channels (e.g. inputs/outputs) needed on a controller; making more capacitive sensing measurements with a controller without a need for an increased number of sensor channels; and/or using a controller with a smaller number of sensor channels for a task that would normally require a controller with a larger number of sensor channels.

Discussion will begin with a description of an example capacitive sensing device with a combinatorial sensor layout. An example layout of activation regions in a larger capacitive sensor array that utilizes a combinatorial sensor layout, will then be described. Several non-limiting examples of activation regions of a capacitive sensor array will then be described. Discussion will then be directed toward an example method for determining capacitance in accordance with the embodiments described herein. Finally, an example method for providing a capacitance sensing device, in accordance with the embodiments described herein, will be described.

Example Capacitive Sensing Device

FIG. 1A is a diagram of an example capacitive sensing device 100 that utilizes a combinatorial sensor layout, according to an embodiment. By "combinatorial" what is mean is that at least one of the sensor channels of a controller is used for both receiving and transmitting during the sensing/determining of capacitance and that the layout of the capacitive sensor array takes this into account allowing more combinations of sensor channels and activation regions. It is appreciated that in various embodiments, capacitive sensing device 100 may configured and utilized as a touch panel, one or more touch sensitive "buttons," and/or a touch sensitive display, among other uses.

Capacitive sensing device 100 comprises a capacitive sensor array 120 that is coupled with a controller 110. Capacitive sensor array 120 is used for sensing capacitance relative to a surface, such as a touch surface. Capacitive sensor array 120 includes a set of sensor electrodes 122 that are arranged to form a plurality of activation regions 124 (124-1, 124-2, 124-3, 124-4, 124-5, 124-6) that are arranged in a two by three rectangular array. It is appreciated that, using the combinatorial approach, only four sensor channels 115 are required to form this two by three array of activation regions 124, whereas a conventional array that utilized sensor channels which each acted only as a driver or only as a receiver would require five sensor channels. Similarly, only three sensor channels 115 are required to form a one by three array of activation regions 124 using the combinatorial approach, whereas a conventional array that utilized sensor channels which each acted only as a driver or only as a receiver would require four sensor channels (four sensor channels would be able to provide up to six activation regions using the combinatorial approach). In larger arrays that use the combinatorial sensor approach, such as capacitive sensor array 220A of FIG. 2A, an even greater savings is realized in sensor channels required. The sensor channel and sensor electrode savings can be in the range of 25% or more as compared to the conventional approach. As can be seen, when three or more sensor channels are required in a design of a capacitive sensing device, the combinatorial approach can yield a capacitive sensing device in which the plurality of activation regions 124 in the capacitive sensor array is greater in number than the plurality of sensor channels 115 that are used to form the capacitive sensing array.

Figure 3A:
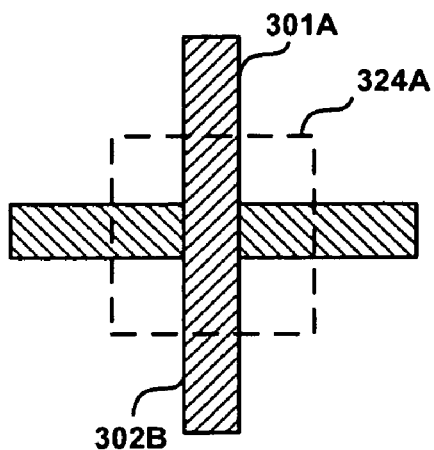
FIGS. 3A, 3B, and 3C are example diagrams of activation regions, according to various embodiments.
Figure 3B:
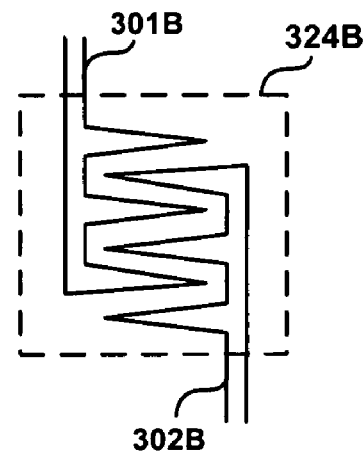
Figure 3C:
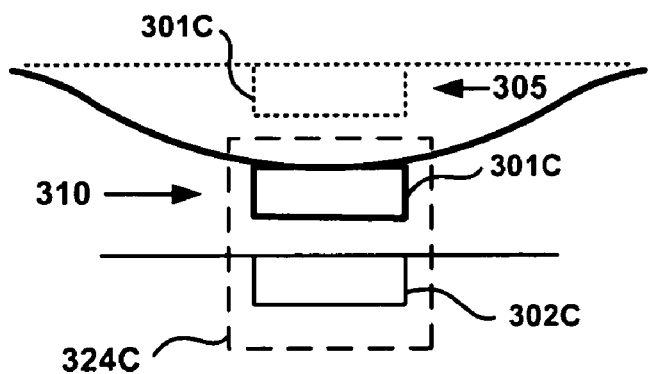

A sensor electrode 122 comprises a conductive trace or deposition of conductive material. An activation region 124 is a region that forms a single capacitive sensor, shown as single capacitances within activation regions 124 in FIG. 1A (e.g., capacitance 130 in activation region 124-1). Activation regions 124 can be formed in many ways, some non-limiting examples of which are illustrated in FIGS. 3A, 3B, and 3C. Sensor channels 115 of controller 110 are depicted as inputs/outputs of an integrated circuit, and can be used to both transmit and receive information. It should be appreciated that sensor channels 115 can comprise pins, bonding pads, wires, channels and the like. It is appreciated that in some embodiments, controller 110 is implemented as an Application Specific Integrated Circuit (ASIC).

As shown in FIG. 1A, and as will be described in more detail below, individual sensor channels 115 of controller 110 are ohmically coupled to individual sensor electrodes 122 of sensor array 120. Note, however, that adding one or more capacitive elements in series with the sensor electrode and a capacitance at an activation region can still allow signals to be transmitted and indicia to be received with the ohmically coupled trace for determining a total series capacitance. Although controller 110 is shown configured with five sensor channels 115 (115-1, 115-2, 115-3, 115-4, and 115-n) it is appreciated that in other embodiments, a controller 110 can be configured with more than five sensor channels 115 (e.g., eight, sixteen, twenty-four or some other number of sensor channels) and can be configured with as few as three sensor channels 115. It is appreciated that at least one of the sensor channels 115 and as many as all of the sensor channels 115 are used for both transmitting and receiving information when determining a capacitance with a capacitive sensing device (e.g. capacitive sensing device 100) in which controller 110 is used.

It is appreciated that in most embodiments, a sensor channel/sensor electrode combination will have a low impedance when transmitting. In one embodiment a transmitter and a receiver, both with low impedance, can be identified as when the signal that is received by the receiving sensor electrode 122 is substantially altered by an input object relative to the transmitting and/or receiving sensor electrodes but this does not substantially alter voltage on either the transmitting or receiving sensor electrodes 122. If controller 110 transmits simultaneously on multiple sensor electrodes 122, in most cases there are different transmissions (in sequence or code for example) on the transmitting sensor electrodes 122 to distinguish the simultaneously transmitted signals from each other. It is also appreciated that in some embodiments, a single first sensor electrode can be used to concurrently transmit and receive. For example, by driving a second transmitting sensor electrode with a low impedance signal and modulating the first transmitting and receiving sensor electrode relative to the second transmitting sensor electrode and relative to a third receiving electrode. In other embodiments the receiving sensor electrode 122 may have high impedance such that when a transmitted signal is received by the receiving sensor electrode 122 it is substantially altered by an input object relative to an associated activation region. The high impedance would then allow the input object to substantially alter the voltage on the receiving sensor electrode, and potentially not on the transmitting sensor electrode. Similarly, in another embodiment, the transmitter sensor electrode may have high impedance (e.g. affected by the input object) and the receiving sensor electrode may have high or low impedance.

With continued reference to FIG. 1A, capacitive sensing device 100 comprises a set of sensor electrodes 122 comprising a first sensor electrode 122-1, a second sensor electrode 122-2, a third sensor electrode 122-3, and a fourth sensor electrode 122-4 that are arranged to form a plurality of activation regions 124. As shown in FIG. 1A, first sensor electrode 122-1 meets second sensor electrode 122-2 at a first activation region 124-1. Third sensor electrode 122-3 meets first sensor electrode 122-1 to form a second activation region 124-2. Second sensor electrode 122-2 meets third sensor electrode 122-3 to form third activation region 124-3. In one embodiment, sensor array 120 consists of only these three sensor electrodes 122-1, 122-2, 122-3 and these three activation regions 124-1, 124-2, 124-3. In other embodiments, such as the embodiment of FIG. 1A, additional sensor electrodes 122 and activation regions 124 are included in sensor array 120. For example, as shown in FIG. 1A, fourth sensor electrode 122-4 meets first sensor electrode 122-1 to form a fourth activation region 124-4, meets second sensor electrode 122-2 to form a fifth activation region 124-4, and meets third sensor electrode 122-3 to four sixth activation region 124-6. In one embodiment, as illustrated in FIG. 1A, multiple sensor channels 115 can be used to both transmit and receive in order to measure capacitance associated with activation regions 124.

As shown in FIG. 1A, controller 110 comprises a plurality of sensor channels 115 (115-1, 115-2, 115-3, 115-4 . . . 115-n) that are configured as inputs, outputs, or combination inputs/outputs for controller 110. Controller 110 further comprises a system ground 114. A first sensor channel 115-1 is ohmically coupled to first sensor electrode 122-1, a second sensor channel 115-2 is ohmically coupled to second sensor electrode 122-2, and a third sensor channel 115-3 is ohmically coupled to third sensor electrode 122-3. At least the first sensor channel 115-1 is configured to both transmit and receive electrical signals. First indicia for sensing capacitances associated with activation region 124 (e.g. 124-2 and 124-3) is received with the first and second sensor channels (115-1, 115-2) while the third sensor channel (115-3) transmits an electrical signal and second indicia for sensing capacitances associated with plurality of activation regions 124 (e.g. 124-1) is received with second sensor channel 115-2 while first sensor channel 115-1 transmits an electrical signal. In one embodiment "indicia" comprise a capacitive measurement/measurements such as capacitive measurement of charge transferred at an activation region 124. It is appreciated that, in some embodiments, the indicia can comprise an "indicium," or single measurement. In a like manner, additional indicia can be gathered from other activation regions by transmitting on one of the two sensor electrodes 122 of the particular activation region 124 and receiving on the other of the two sensor electrodes 122. For example, in one embodiment, third indicia are received at activation region 124-6 with third sensor electrode 122-3 while fourth sensor electrode 122-4 transmits an electrical signal. During operation of capacitive sensing device 100, the plurality of sensor electrodes (e.g. sensor electrodes 122) provides indicia that are received by a controller, such as controller 110. The indicia reflect user input in the sensing region of a sensor array, such as sensor array 120. Since user input in the sensing region affects the electric field surrounding the sensor electrodes, the indicia can be electric signals that change with the electric field surrounding the sensor electrodes. For example, the indicia may include voltages, currents, charges, frequencies, time constants, or any other items that vary with changes in the capacitive coupling of the sensor electrodes (e.g. capacitance 130).

With respect to the activation regions 124, numerous sensing techniques can be employed to receive the indicia that are used to determine capacitances associated with the activation regions 124. Controller 110 controls the transmitting of electrical signals, receiving of indicia used to determine capacitance, timing of transmitting and receiving, and the selection of which sensor channels 115 are used for transmitting and receiving. As sensor channels 115 are ohmically coupled with sensor electrodes 122, controller 110 also controls transmitting, receiving, timing, and selection of sensor electrodes 122 that are used to transmit and/or receive. In some embodiments, controller 110 transmits (substantially) on a one-at-a-time basis with the sensor channels 115 that are used for transmitting such that, for at least a span of time, a transmission is only occurring on a single sensor channel 115 and on no other sensor channels 115. In some embodiments, controller 110 transmits concurrently with multiple sensor channels 115.

In one embodiment, while transmitting in this one-at-a time basis, only one sensor channel 115 is actively transmitting at a time. In another embodiment, while transmitting in this one-at-a time basis, only one sensor channel 115 is actively transmitting a signal that is to be received by a receiving sensor electrode 122. In one embodiment, even though transmission is done on a one-at-a-time basis, there may be an overlap of time where multiple sensor channels 115 are briefly transmitting at the same time. For example, in one embodiment, the end of transmission by sensor channel 115-1 may briefly overlap with the beginning of a transmission by another sensor electrode such as sensor channel 115-3. Thus, it follows that the sensor electrodes 122 coupled to these sensor channels 115 may also experience slightly overlapping transmissions even when transmitting is performed on a substantially one-at-a-time basis.

In one embodiment, while a single sensor channel 115 is transmitting, receiving of indicia is performed with at least one non-transmitting sensor channel 115 at a time. For example, in one such embodiment, while transmitting on sensor electrode 122-3 with sensor channel 115-3 (and with no other sensor channels 115 transmitting) for a span of time; receiving is performed with either sensor electrode 122-1 via sensor channel 115-1 or with sensor electrode 122-2 via sensor channel 115-2. In this manner, indicia can be received with sensor electrode 122-1 via sensor channel 115-1 and additional indicia can be received with sensor electrode 122-2 via sensor channel 115-2. Similarly, in one such embodiment, while transmitting on sensor electrode 122-4 with sensor channel 115-4 (and with no other sensor channels 115 transmitting) for a span of time; receiving is performed with either sensor electrode 122-1 via sensor channel 115-1, with sensor electrode 122-2 via sensor channel 115-2, or with sensor electrode 122-3 via sensor channel 115-3.

In one embodiment when one sensor channel 115 (e.g., sensor channel 115-3) is transmitting for a span of time with no other sensor channels 115 transmitting, controller 110 uses a scanned approach to receive indicia on a one-at-a-time basis from a plurality or all of the other sensor channels 115 that are not transmitting. Following the previous example of transmitting on sensor electrode 122-3 with sensor channel 115-3 for a span of time, controller 110 receives on a one-at-a-time basis with sensor electrode 122-1 via sensor channel 115-1 for one portion of the span of the transmission time and then receives on a one-at-a-time basis with sensor electrode 122-2 via sensor channel 115-2 during another separate distinct portion of the span of the transmission time. In this manner, indicia can be received with sensor electrode 122-1 via sensor channel 115-1 and additional indicia can be received with sensor electrode 122-2 via sensor channel 115-2.

In one embodiment, while a single sensor channel 115 is transmitting for a span of time (with no other sensor channels simultaneously transmitting), receiving of indicia can be performed with multiple sensor channels 115 simultaneously. For example, in one such embodiment, while transmitting on sensor electrode 122-3 with sensor channel 115-3 (and with no other sensor channels 115 transmitting) for a span of time; receiving is performed concurrently during a portion of this span of time with sensor electrode 122-1 via sensor channel 115-1 and with sensor electrode 122-2 via sensor channel 115-2. In this manner, indicia can be received with sensor electrode 122-1 via sensor channel 115-1 and concurrently additional indicia can be received with sensor electrode 122-2 via sensor channel 115-2.

As mentioned above, in one embodiment, controller 110 transmits concurrently on multiple sensor electrodes 122 during a span of time. For example, in one embodiment, this can comprise transmitting with sensor electrode 122-1 via sensor channel 115-1 while concurrently transmitting with sensor electrode 122-3 via sensor channel 115-3. This concurrent transmitting can comprise transmitting coded transmissions such that each of the simultaneously transmitting sensor channels 115 transmits a coded transmission that is different from the transmission of any other simultaneous transmission. In another embodiment, the concurrent transmitting can comprise transmitting with different phases on each transmitting electrode. Indicia can be received with one or more non-transmitting sensor channels 115, either concurrently or on a scanned basis, while the concurrent transmission is taking place.

Figure 1B:
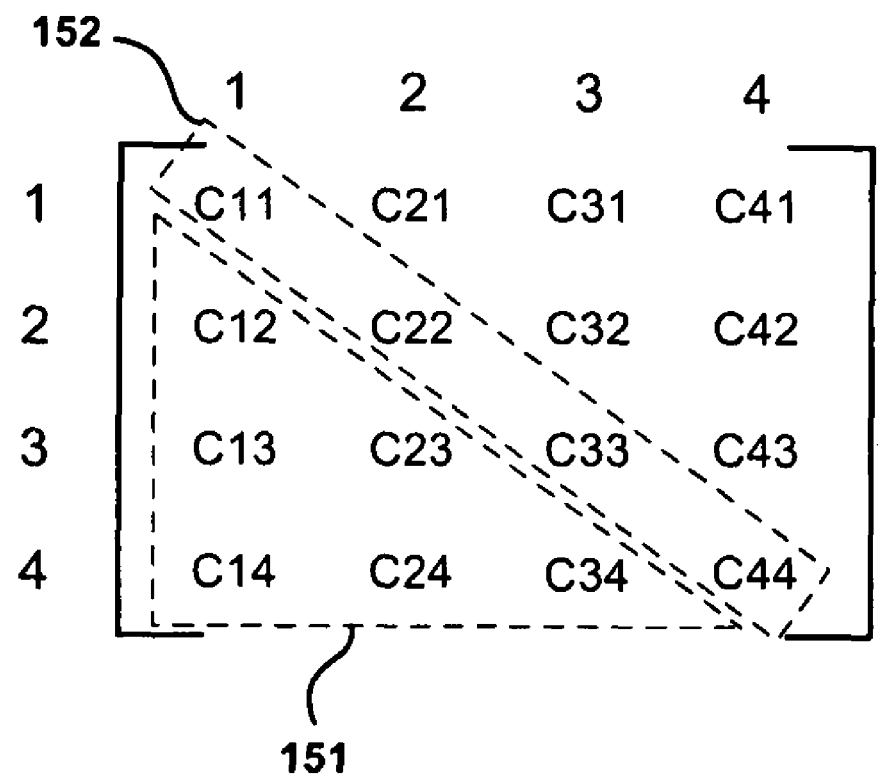
FIG. 1B depicts a representation of a symmetric capacitance matrix for four sensor electrodes.

FIG. 1B depicts a representation of a symmetric capacitance matrix 150 for four sensor electrodes. The representation depicts all the possible capacitive measurements that could be made when four sensor electrodes are used for both receiving and transmitting. When sensor electrodes 1-4 are utilized, it is possible to create sixteen capacitive measurements (C1, C12, C13, C14, C21, C22, C23, C24, C31, C32, C33, C34, C41, C42, C43, and C44) and ten distinct capacitive measurements (C11, C12, C13, C14, C22, C23, C24, C33, C34, and C44). Within FIG. 1B, the first number of a depicted capacitive measurement is the transmitting sensor electrode while the second number is the receiving sensor electrode. For example a capacitive measurement between transmitting sensor electrode 1 and receiving sensor electrode 2 is represented as C12. When the representation indicates a transmitting sensor electrode that is the same as the receiving sensor electrode, such as C11, the capacitive measurement is actually measured between that sensor electrode and system ground 114. In such a case the receiving/transmitting (sensing) sensor electrode is modulated relative to system ground 114. In one embodiment the receiving/transmitting (sensing) sensor electrode is modulated relative to system ground 114 and all other sensor electrodes. In one embodiment, the other sensor electrodes are held at a stationary voltage while the receiving/transmitting sensor electrode (e.g., sensor electrode 1 in the case of measurement C11) is modulated. In another embodiment the other sensor electrodes are modulated such that they are not detectable (e.g. guarded) by the receiving/transmitting electrode. By making both types of capacitive measurements with a pair of sensor electrodes shown in regions 151 and 152, the total number of measurements can be increased for the same number of sensor electrodes. For example, in FIG. 1A, six activation regions are depicted, providing six capacitive measurements of the manner of the capacitive measurements shown in region 151 of capacitance matrix 150. However, if both types of capacitive measurements were made, it would be possible to make ten distinct total measurements. In one embodiment, a capacitive measurement made between a modulated sensor electrode and system ground can be used to provide improved proximity sensing.

FIG. 2A is a block diagram of an example layout of a capacitive sensor array 220A, according to an embodiment. Capacitive sensor array 220A represents a combinatorial layout of a larger array than sensor array 120 of FIG. 1A. Capacitive sensor array 220A requires only sixteen sensor channels (labeled 1-16) to form a fifteen by eight rectangular sensor array. A similarly sized array using the conventional approach would require a controller with twenty-three sensor channels. Even though FIG. 2A depicts that all possible activation regions are being used, all of the activation regions (e.g. given the number of inputs/outputs) need not be used in every embodiment. This means that in some embodiments, fewer activation regions than shown are possible. Moreover, though a rectilinear pattern is depicted in FIG. 2A, other shapes of capacitive sensor array 220A are possible and anticipated.

Activation regions in capacitive sensor array 220A are represented as a comma separated combination of the sensor channels that meet to form each of the particular activation regions of the array. For example, sensor channels 1 and 16 meet to form activation region (01,16) that is shown in the lower left hand corner of capacitive sensor array 220A. The ordering of the numbers of the sensor channels is represented as (TX, RX), in one embodiment, where the first sensor channel listed is the transmitter and the second is the receiver. It is appreciated that this convention is utilized in FIG. 2A, but it could be reversed or not utilized in other embodiments.

It is appreciated that, with the use of vias, jumpers, or the like, the set of sensor electrodes of capacitive sensor array 220A, or any square or rectangular combinatorial capacitive sensor array, can be routed such that only two conductive layers are required to form the activation regions in the sensor array. Having only two conductive layers simplifies manufacture. Some selected examples of the routing to form capacitive sensor array 220A with only two conductive layers are shown in the routing of sensor electrode 202 that is ohmically coupled with sensor channel 2, the routing of sensor electrode 213 that is ohmically coupled with sensor channel 13, and the routing of sensor electrode 216 that is ohmically coupled with sensor channel 16. Routings of additional sensor channels are not shown so as not to obscure and disrupt the clarity of FIG. 2A.

From the three displayed routings, it can be seen that capacitive sensor array 220A can be formed, in one embodiment, with all of the sensor channels (1-16) entering and coupling to the array on one edge. For example, in the displayed embodiment, sensor channels 1-16 enter on the left edge, with only sensor channel 1 being routed slightly from the left edge to the bottom left corner edge of capacitive sensor array 220A. In one such embodiment, the transmitting sensor electrode is routed on top of the receiving sensor electrode in each activation region (where the top is the side of capacitive sensor array 220A that is meant to be closest to a capacitive sensing reference surface such as the surface of a capacitive touch navigation pad). In various embodiments, jumpers and/or vias can be utilized to accomplish such routing. In other embodiments, more than one separate layer with the routed sensor electrodes, or a folder layer may be utilized.

As is further demonstrated in FIG. 2A, only about half of the sensor electrodes need to be routed on an exterior edge of such a combinatorial capacitive sensor array minimizing the routing regions outside the sensor array. An example of this edge routing is shown by the routing of sensor electrode 213 on the right edge of capacitive sensor array 220A. As can be seen, this routing is performed on the opposite edge from where the sensor channels 1-16 are coupled with the sensor electrodes. Although not depicted, in order to preserve clarity of FIG. 2A, sensor electrodes that are coupled with sensor channels 14, 12, 11, 10, 9, and 16 are also routed along the right edge of capacitive sensor array 220A in a similar fashion to the depicted right edge routing of sensor electrode 213.

Figure 2B:
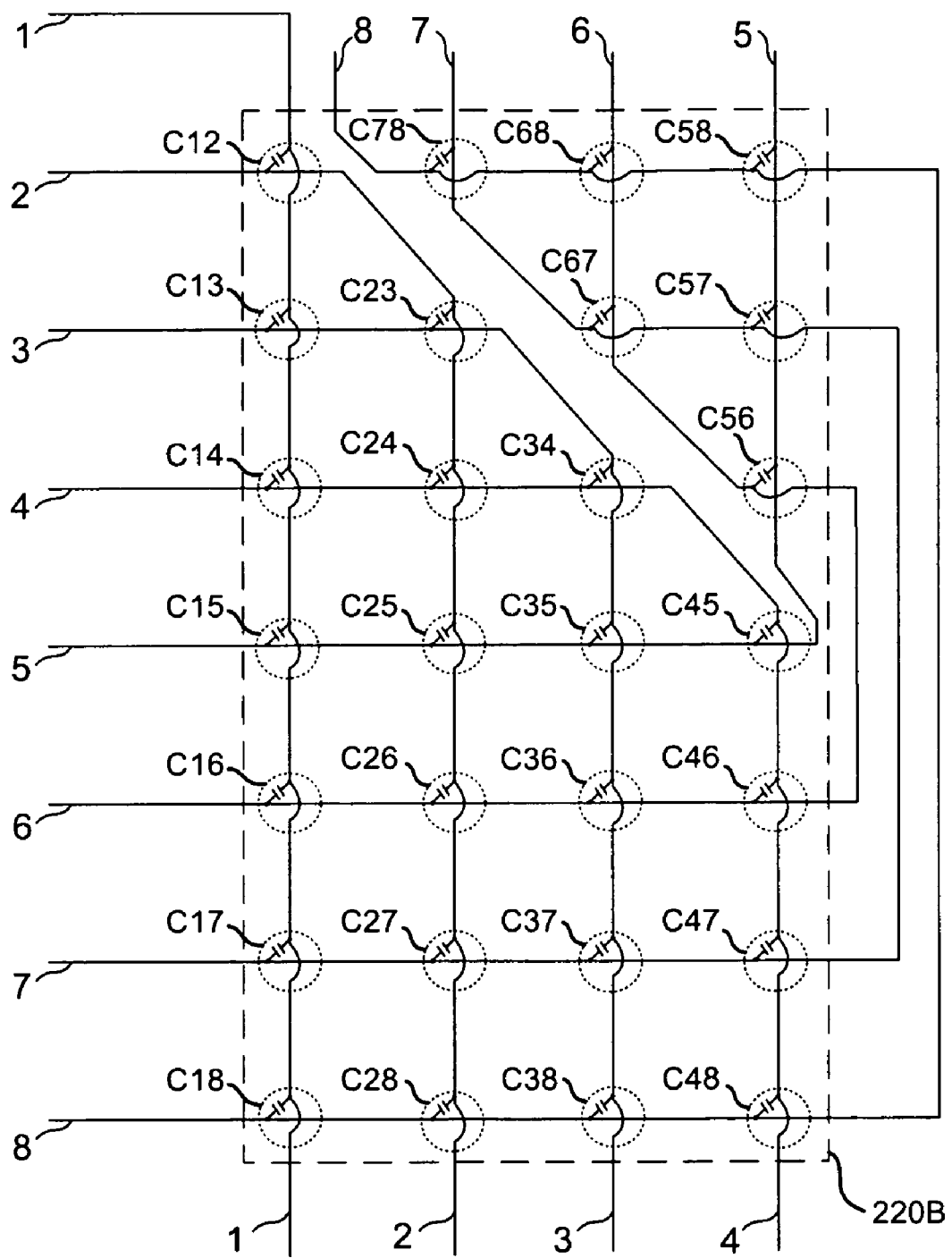
FIG. 2B is a block diagram of another example layout of a capacitive sensor array, according to an embodiment.

FIG. 2B is a block diagram of an example layout of a capacitive sensor array 220B, according to an embodiment. Capacitive sensor array 220B is similar to capacitive sensor array 220 shown in FIG. 2A, but only incorporates eight sensor channels and represents 7×4 activation regions. It is further appreciated that FIG. 2B illustrates one embodiment of a combinatorial layout that is able to provide the sensing array using just jumpers; however, other embodiments could use different combinations of vias and jumpers. The labeling scheme used in FIG. 2B follows the labeling scheme employed in FIG. 1B. For example, capacitive measurement C12 is made using sensor electrode 1 as a transmitter and sensor electrode 2 as a receiver. Even though FIG. 2B depicts that each pair of possible combinations of sensor electrodes are being used, all of the activation regions (e.g. given the number of paired inputs/outputs) need not be used in every embodiment. This means that in some embodiments, fewer activation regions than shown are possible. Moreover, though a rectilinear pattern is depicted in FIG. 2B, other shapes of sensor array 220B are possible and anticipated. Note, that in another embodiment, the bottom and top sides may be shortened by routing sensing electrodes (1, 2, 3, 4 and 5, 6, 7, 8 respectively) on the left hand side.

Figure 2C:
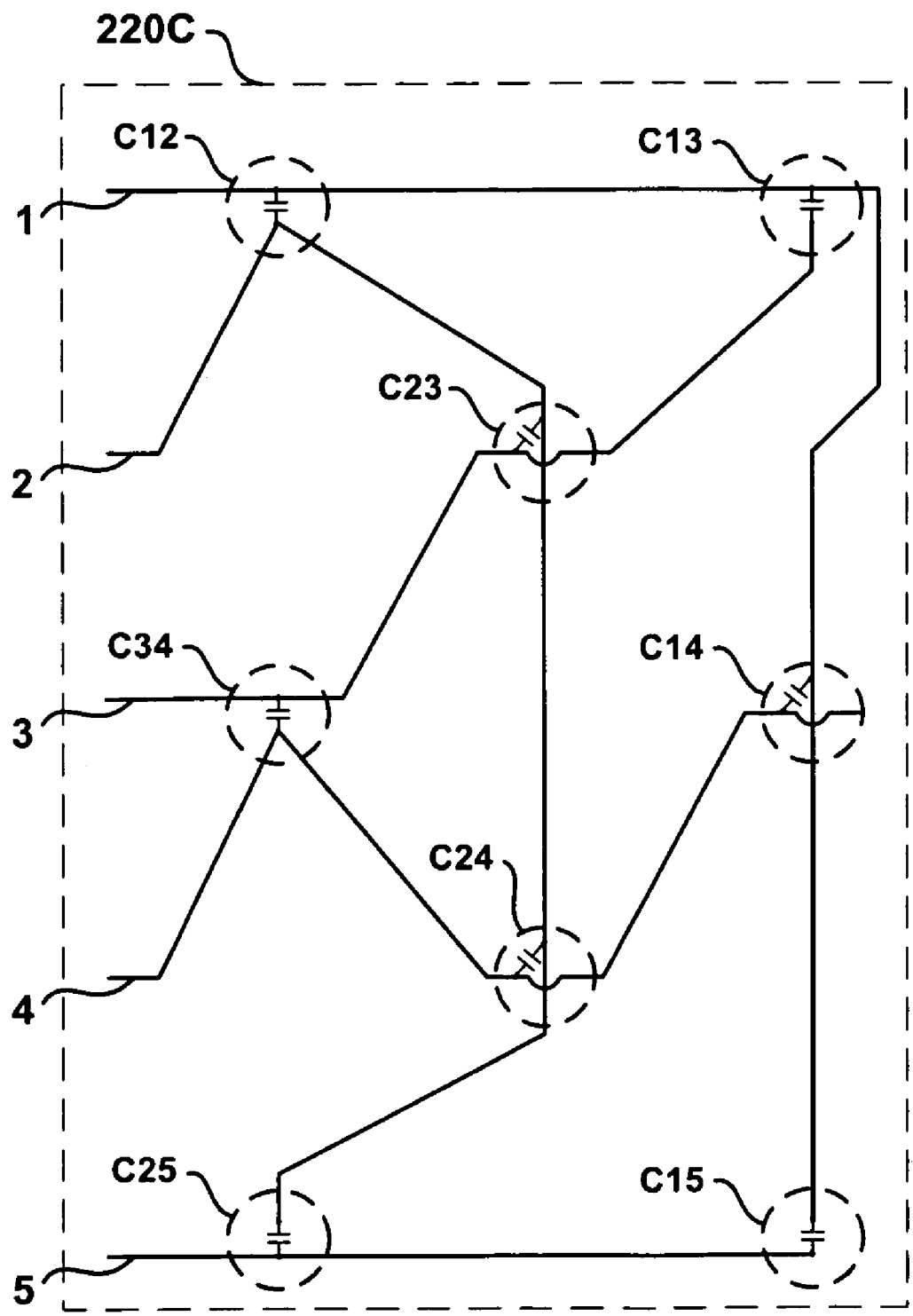
FIG. 2C is a block diagram of another example layout of a capacitive sensor array, according to an embodiment.

FIG. 2C is a block diagram of an example layout of capacitive sensor array 220C. Capacitive sensor array 220C incorporates five sensor channels and five sensor electrodes (1, 2, 3, 4, and 5) to create eight distinct capacitive measurements and activation regions (which may also be referred to as capacitive sensor buttons). In the illustrated embodiment in FIG. 2C, a first sensor channel is ohmically coupled with sensor electrode 1, a second sensor channel is ohmically coupled with sensor electrode 2, a third sensor channel is ohmically coupled with sensor electrode 3, a fourth sensor channel is ohmically coupled with sensor electrode 4, and a fifth sensor channel is ohmically coupled with sensor electrode 5. In the embodiment shown in FIG. 2C, each capacitive sensor button within capacitive sensor array 220C is created at an activation region. For example, a capacitive sensor button is created at activation region C12, where the capacitive measurement is made by transmitting on sensor electrode 1 and receiving on sensor electrode 2. In the embodiment shown in FIG. 2C, sensor electrodes 2 and 3 are both transmitters and receivers. The remaining seven capacitive sensor buttons are created in a like fashion at the other depicted activation regions (C13, C14, C15, C23, C24, C25, and C34). Even though FIG. 2C depicts using only a portion of the total possible activation regions, in some embodiments, fewer activation regions than shown may be used or more activation regions than shown may be used. Also note in the embodiment shown, no edge routing outside the activation regions is required.

Figure 2D:
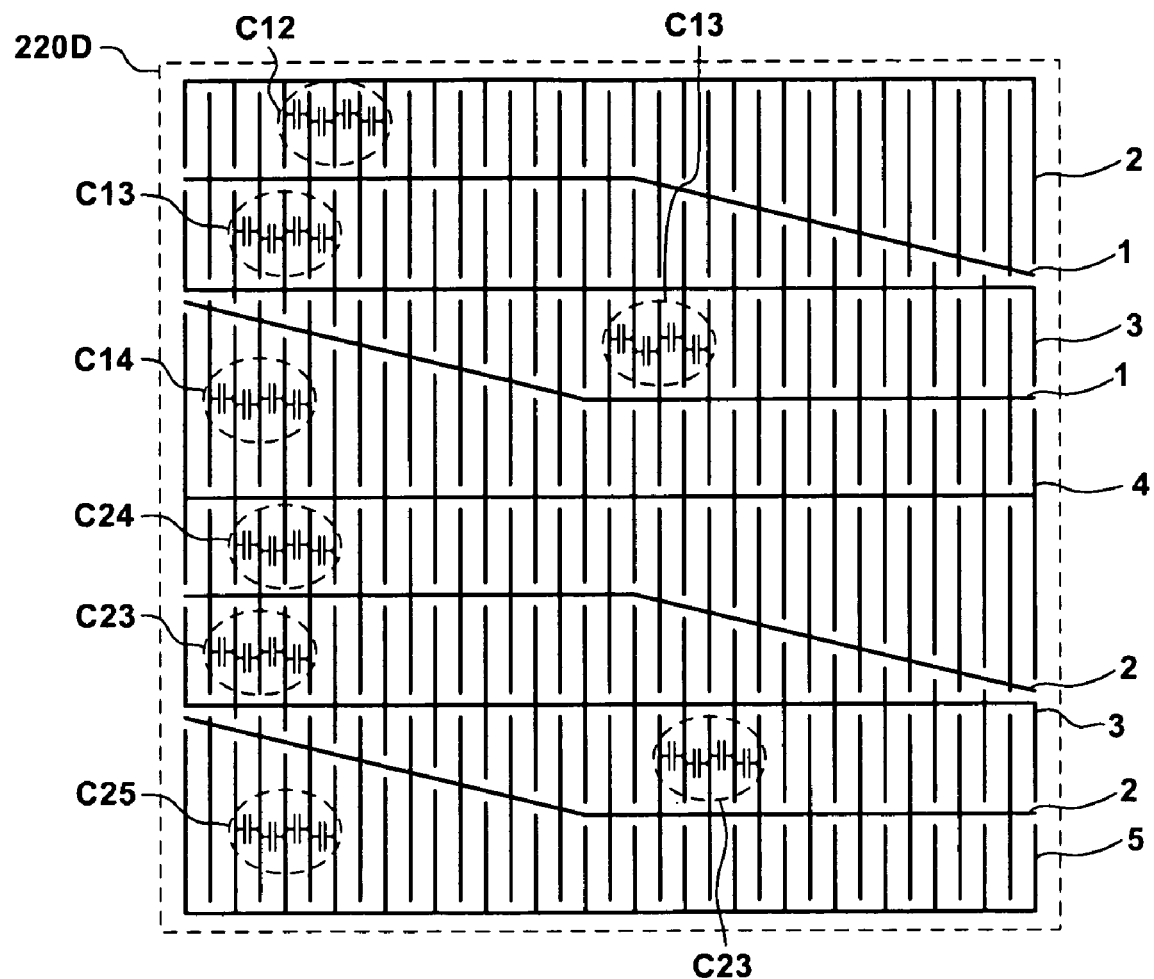
FIG. 2D is a block diagram of another example layout of a capacitive sensor array, according to an embodiment.

FIG. 2D is a bock diagram of an example layout of capacitive sensor array 220D. Capacitive sensor array 220D is an example of an alternative sensor array and illustrates the creation of six distinct capacitive measurements by using five sensor channels and only five sensor electrodes (1, 2, 3, 4, 5). In the illustrated embodiment of FIG. 2D, a first sensor channel is ohmically coupled with sensor electrodes 1, a second sensor channel is ohmically coupled with sensor electrodes 2, a third sensor channel is ohmically coupled with sensor electrodes 3, a fourth sensor channel is ohmically coupled with sensor electrodes 4, and a fifth sensor channel is ohmically coupled with sensor electrode 5. In one embodiment, capacitive measurements at activation regions C12, C13, and C14, can be created by transmitting on sensor electrodes 1 and receiving on sensor electrodes 2, 3 and 4. Similarly, capacitive measurements at activation regions C23, C24 and C25 can be created by transmitting on sensor electrodes 2 and receiving on sensor electrodes 3, 4 and 5. In such an embodiment, sensor electrode 2 is both a transmitter and receiver.

In the embodiment shown in FIG. 2D, capacitive measurements at activation regions C12, C13, C14, C23, C24 and C24 represent detail views. As such, these detail views represent only a portion of the total capacitive measurements that can be made in a particular activation region. Likewise, these detail views represent only a portion of the possible size of each activation region. It is appreciated that, a capacitive measurement can be made wherever a transmitting sensor electrode is interleaved with a receiving sensor electrode. Thus, in one embodiment, the size of the activation region is equal to the area defined by where a transmitting sensor electrode is interleaved with a receiving sensor electrode. Consider for example sensor electrodes 1 and 2, in one embodiment, the size of an activation region (e.g. C12) implemented using sensor electrodes 1 and 2 can be equal to the total area over which transmitting sensor electrode 1 is interleaved with receiving sensor electrode 2 and is not limited to the size of detail activation region C12. In such an activation region, an input object would affect the coupling of sensor electrodes differently base upon the input object's area of coverage. For example, an input object may only affect the region represented by C12.

With reference again to FIG. 1A, a conventional layout such as FIG. 1A would require a controller with five sensor channels. However, using the combinatorial approach, only four sensor channels 115 were required in order to create a capacitive sensor array with six capacitive activation regions 124 that can be used to measure capacitances. Thus, in the conventional method, the number of sensor channels required for a square or rectangular layout is X by Y, where X represents the sensor electrodes in the length dimension of the capacitive sensor array and Y represents the sensor electrodes in the width dimension of the capacitive sensor array. Using a conventional layout to achieve a 2 by 3 array and six activation regions for making capacitive measurements requires at least five sensor channels and five sensor electrodes. In the combinatorial approach, by using at least a single sensor channel of controller 110 for both transmitting and receiving, the total number of sensor channels and sensor electrodes required to form the 2 by 3 capacitive sensor array 120 of FIG. 1A is reduced to four sensor channels and four sensor electrodes.

Under the combinatorial layout approach shown used in FIG. 1A, Equation 1 (shown below) can be used to determine the minimum number of sensor electrodes required to perform a number of capacitive measurements between pairs of electrodes, $$\binom{N}{2} = \frac{N*(N-1)}{2} = Cmeasurements \qquad \text{Equation 1}$$

where N is equal to the total number of sensor electrodes.

Based on Equation 1, it can be seen that only four sensor electrodes are required to perform six capacitive measurements. This provides a savings of one sensor electrode as compared to the conventional method. Moreover, the savings greatly increases as more measurements are required. In the example of FIG. 2A, a capacitive sensor array 220A with 120 activation regions is shown with a combinatorial layout. Because several sensor electrodes are used to both transmit and receive; only sixteen sensor electrodes were used in this layout. In contrast at least twenty-three sensor electrodes would be required in a similar conventional layout of a capacitive sensor array with the dimensions of capacitive sensor array 220A and at least and twenty-two sensor electrodes would be required in an 11 by 11 square capacitive sensor array (with a possible 121 activation regions). For large sensor arrays, such as those approximately the size of capacitive sensor array 220A or larger, the combinatorial approach described herein yields a savings of sensor electrodes required of approximately 30% versus the conventional approach for square arrays. For rectangular sensor arrays, the savings in sensor electrodes required, versus the convention approach, for a given layout size is higher than the savings experienced for square arrays. Moreover, for large numbers of sensor electrodes (e.g., approximately sixteen or higher) the term N−1 of Equation 1 approximates N and Equation 1 is reduced to the form shown below as Equation 2.

$$\frac{N^2}{2} \approx Cmeasurements \qquad \text{Equation 2}$$

FIGS. 3A, 3B, and 3C are example diagrams of activation regions 324, according to various embodiments. It is appreciated that FIGS. 3A, 3B, and 3C are provided by way of example and not of limitation and that many other types designs of activation regions may be utilized with the embodiments described herein. The activation regions 324 of FIGS. 3A, 3B, and 3C represent details of various example implementations that may be used as activation regions 124 of FIG. 1A, in accordance with embodiments described herein.

FIG. 3A is a plan view showing a simple activation region 324A where sensor electrodes 301A and 302A cross over one another at different vertical levels and are separated by some form of dielectric (not visible). In one embodiment, an activation region such as activation region 124-1 of FIG. 1A comprises a capacitance 130 defined by a crossing of at least two sensor electrodes (e.g., sensor electrodes 122-1 and 122-2) in a manner similar to that shown in FIG. 3A.

FIG. 3B is a plan view showing an interdigitated activation region 324B where sensor electrodes 301B and 302B are configured to interdigitate within one another while remaining separated by a spacing or dialectic. It is appreciated that other forms of interdigitation may be substituted for the example of FIG. 3B. In one embodiment, an activation region such as activation region 124-1 of FIG. 1A comprises a capacitance 130 defined by an interdigitation of at least two sensor electrodes (e.g., sensor electrodes 122-1 and 122-2) in a manner similar to that shown in FIG. 3B.

FIG. 3C is a side/elevational view showing a deflectable activation region 324C where sensor electrodes 301C and 302C are arranged in a first, undeflected position 305 where they are separated from one another to an extent that capacitive coupling between sensor electrodes 301C and 302C is weak or non-existent. However when deflected from undeflected position 305 to deflected position 310, such as when pushed by a finger, stylus, or other object, sensor electrodes 301C and 302C become closer to one another and sensor electrode 301C enters activation region 324C, where capacitive coupling between sensor electrodes 301C and 302C is greater that at position 305 or is capable of taking place. It is appreciated that other forms of deflectable activation regions are possible and may be substituted for the example of FIG. 3C. In one embodiment, an activation region such as activation region 124-1 of FIG. 1A comprises an electrode 122 (e.g., electrode 122-1) that that is a portion of a deflectable structure (similar to that of sensor electrode 301C of FIG. 3C). Similarly, some or all of the activation regions 124 of FIG. 1A may comprise sensor electrodes 122 that are incorporated in deflectable structures. Various layers of structures may be included to limit the motion of 301C towards 302C including spacers, interleaved dielectric layers and the like.

Example Methods of Operation

The following discussion sets forth in detail the operation of some example methods of operation in accordance with embodiments described herein. With reference to FIG. 4, flow diagram 400 illustrates example procedures used by various embodiments. Flow diagram 400 includes some processes that, in various embodiments, are carried out by or in conjunction with a processor or controller under the control of computer-readable and computer-executable instructions. In one embodiment, the computer-readable and computer-executable instructions reside, for example, in data storage features such as logic, circuitry, or memory of or accessibly by controller 110 or FIG. 1A. The computer-readable and computer-executable instructions, which may reside on tangible computer readable storage media, are used to control or operate in conjunction with, for example, controller 110. Although specific procedures are disclosed in flow diagram 400, such procedures are examples. That is, embodiments are well suited to performing various other procedures or variations of the procedures recited in flow diagram 400. It is appreciated that the procedures in flow diagram 400 may be performed in an order different than presented, and that not all of the procedures in flow diagram 400 may be performed.

Example Method for Determining Capacitance

FIG. 4 is a flow diagram of a method for determining capacitance, according to an embodiment. Elements of flow diagram 400 are described below, with reference to elements of FIG. 1A. It is appreciated that, in various embodiments, electrical signals for transmitting are provided by controller 110 to transmitting sensor electrodes 122 for transmitting and received indicia are coupled to controller 110 by receiving electrodes 122 for determination of capacitances in the associated activation region(s).

At 410 of flow diagram 400, in one embodiment, the method employs a set of sensor electrodes. In one embodiment, this comprises employing a set of sensor electrodes 122 similar to those shown in FIG. 1A. With reference to FIG. 1A, in one embodiment, the set of sensor electrodes comprises at least a first sensor electrode 122-1, a second sensor electrode 122-2, and a third sensor electrode 122-3. Additional sensor electrodes (such as sensor electrode 122-4) are included in some embodiments. Following the example of FIG. 1A, first sensor electrode 122-1 meets second sensor electrode 122-2 at a first activation region 124-1 of a plurality of activation regions 124; first sensor electrode 122-1 meets third sensor electrode 122-3 at a second activation region 124-2; and second sensor electrode 122-2 meets third sensor electrode 122-3 at a third activation region 124-3. In one embodiment where fourth sensor electrode 122-4 is included, it meets at least one of first sensor electrode 122-1, second sensor electrode 122-2, and/or third sensor electrode 122-3 in a fourth activation region (e.g., activation region 124-4, 124-5, and/or 124-6).

At 420 of flow diagram 400 and with continued reference to FIG. 1A, in one embodiment, the method transmits with third sensor electrode 122-3 while receiving first indicia with first and second sensor electrodes (122-1, 122-2). Such first indicia can be received in activation regions 124-2 and 124-3. As previously described, transmitting with a sensor electrode, such as, for example, sensor electrode 122-3 can be done on a one-at-a-time basis with only a single sensor electrode 122, and no others, transmitting for a span of time. Likewise, in one embodiment and as previously described, the receiving with first and second sensor electrodes (122-1, 122-2) can be on a one-at-a-time basis (e.g., a scanned approach) where only one of these sensor electrodes receives at a time during the span of time while sensor electrode 122-3 transmits. Alternatively, in one embodiment, both the first and second sensor electrodes (122-1, 122-2) can concurrently receive or overlap in receiving during the time span when sensor electrode 122-3 transmits.

At 430 of flow diagram 400 and with continued reference to FIG. 1A, in one embodiment, the method transmits with first sensor electrode 122-1 while receiving second indicia with second sensor electrode 122-2. Such second indicia can be received in activation region 124-1. As previously described, receiving with a sensor electrode, such as sensor electrode 122-2 can be done on a one-at-a-time basis, where for a span of time only a single sensor electrode 122 receives indicia. It is appreciated that, in one embodiment and as described above, transmitting with third sensor electrode 122-3 and transmitting with first sensor electrode 122-1 overlap for at least a portion of time which can be all or some portion of the time that each sensor electrode (122-1, 122-3) is transmitting.

At 440 of flow diagram 400 and with continued reference to FIG. 1A, in one embodiment, the method determines capacitances associated with the first, second, and third activation regions (124-1, 124-2, 124-3) using at least the first indicia and the second indicia. In one embodiment, this is accomplished by coupling the received indicia to controller 110 which determines the capacitances. In one embodiment, controller 110 utilizes one or more charge integrators to determine capacitances from received indicia.

In one embodiment when fourth sensor electrode 122-4 transmits, third indicia is received with third sensor electrode 122-3 (such as in activation region 124-6). This third indicia can be coupled to controller 110 to determine a capacitance associated with activation region 124-6.

Example Method for Providing a Capacitance Sensing Device

FIG. 5 is a flow diagram 500 of a method for providing a capacitance sensing device, according to an embodiment. Elements of flow diagram 500 are described below, with reference to elements of capacitive sensing device 100 of FIG. 1A. It is appreciated that the "providing" described in flow diagram 500 can comprise, manufacturing, designing, selling, and/or assembling components/sub-components of a capacitive sensing device such as capacitive sensing device 100 of FIG. 1A.

At 510 of flow diagram 500, in one embodiment, the method provides a set of sensor electrodes such as sensor electrodes 122 of FIG. 1A. With reference to FIG. 1A, in one embodiment, the set of sensor electrodes comprises at least a first sensor electrode 122-1, a second sensor electrode 122-2, and a third sensor electrode 122-3. Additional sensor electrodes (such as sensor electrode 122-4) are included in some embodiments. Following the example of FIG. 1A, first sensor electrode 122-1 meets second sensor electrode 122-2 at a first activation region 124-1 of a plurality of activation regions 124; first sensor electrode 122-1 meets third sensor electrode 122-3 at a second activation region 124-2; and second sensor electrode 122-2 meets third sensor electrode 122-3 at a third activation region 124-3. In one embodiment where fourth sensor electrode 122-4 is included, it meets at least one of first sensor electrode 122-1, second sensor electrode 122-2, and/or third sensor electrode 122-3 in a fourth activation region (e.g., activation region 124-4, 124-5, and/or 124-6).

At 520 of flow diagram 500, in one embodiment, the method provides a plurality of sensor channels. This can comprise providing a plurality of sensor channels such as sensor channels 115-1 to 115-n or some subset that includes at least three sensor channels 115. In one embodiment, providing a plurality of sensor channels comprises providing a plurality of sensor channels 115 in which multiple ones of the plurality of sensor channels 115 are each configured to both transmit and receive electrical signals for sensing and determining capacitances associated with multiple activation regions of a plurality of activation regions 124.

At 530 of flow diagram 500, in one embodiment, the method ohmically couples a first sensor channel of the plurality of sensor channels to the first sensor electrode. With reference to FIG. 1A, in one embodiment, this comprises ohmically coupling first sensor channel 115-1 to first sensor electrode 122-1.

At 540 of flow diagram 500, in one embodiment, the method ohmically couples a second sensor channel of the plurality of sensor channels to the second sensor electrode. With reference to FIG. 1A, in one embodiment, this comprises ohmically coupling second sensor channel 115-2 to second sensor electrode 122-2.

At 550 of flow diagram 500, in one embodiment, the method ohmically couples a third sensor channel of the plurality of sensor channels to the third sensor electrode. With reference to FIG. 1A, in one embodiment, this comprises ohmically coupling third sensor channel 115-3 to third sensor electrode 122-3. In one embodiment, first sensor channel 115-1 is configured to both transmit and receive electrical signals. In one embodiment, first indicia for sensing capacitances associated with the plurality of activation regions 124 are received with first and second sensor channels (115-1, 115-2) while third sensor channel 115-3 transmits an electrical signal. Second indicia for sensing capacitances associated with the plurality of activation regions 124 are received with second sensor channel 115-2 while first sensor channel 115-1 transmits an electrical signal.

In one embodiment, the method of flow diagram 500 further comprises providing a controller comprising a plurality of sensor channels. With reference to FIG. 1A, in one embodiment, this comprises providing a controller such as or similar to controller 110. In one embodiment, a provided controller, such as controller 110 is configured to receive on a one-at-a-time basis with sensor channels (e.g. 115-1 and 115-2) of plurality of sensor channels 115 provided by the controller. In one embodiment, a provided controller, such as controller 110, is configured to transmit on at least one sensor channel (e.g., sensor channel 115-3) while concurrently receiving on at least two other sensor channels (e.g., sensor channels 115-1 and 115-2).

The foregoing descriptions of specific embodiments have been presented for purposes of illustration and description. They are not intended to be exhaustive or to limit the presented technology to the precise forms disclosed, and obviously many modifications and variations are possible in light of the above teaching. The embodiments were chosen and described in order to best explain the principles of the presented technology and its practical application, to thereby enable others skilled in the art to best utilize the presented technology and various embodiments with various modifications as are suited to the particular use contemplated. It is intended that the scope of the present technology be defined by the claims appended hereto and their equivalents.

What is claimed is:

1. A method for determining capacitance, said method comprising:
   employing a set of sensor electrodes, said set of sensor electrodes comprising at least three sensor electrodes, wherein a first sensor electrode of said set of sensor electrodes meets a second sensor electrode of said set of sensor electrodes at a first activation region of a plurality of activation regions, wherein said first sensor electrode meets a third sensor electrode of said set of sensor electrodes at a second activation region of said plurality of activation regions, and wherein said second sensor electrode meets said third sensor electrode at a third activation region of said plurality of activation regions;
   transmitting with said third sensor electrode while receiving first indicia with said first and said second sensor electrodes;
   transmitting with said first sensor electrode while receiving second indicia with said second sensor electrode; and determining capacitances associated with said first, said second and said third activation regions using at least said first indicia and said second indicia.

2. The method as recited in claim 1, wherein said set of sensor electrodes further comprises a fourth sensor electrode, and wherein said fourth sensor electrode meets at least one of said first, second and third sensor electrodes at a fourth activation region of said plurality of activation regions, and wherein said method further comprises:
receiving with said third sensor electrode.

3. The method as recited in claim 1, wherein said transmitting with said third sensor electrode while receiving first indicia with said first and said second sensor electrodes comprises:
transmitting on a one-at-a-time basis with only said third sensor electrode of said set of sensor electrodes.

4. The method as recited in claim 1, wherein said transmitting with said third sensor electrode while receiving first indicia with said first and said second sensor electrodes comprises:
receiving with said first and said second sensor electrodes of said set of sensor electrodes on a one-at-a-time basis.

5. The method as recited in claim 1, wherein said transmitting with said third sensor electrode while receiving first indicia with said first and said second sensor electrodes comprises:
concurrently receiving with both said first and said second sensor electrodes.

6. The method as recited in claim 1, wherein said transmitting with said third sensor electrode and said transmitting with said first sensor electrode overlap for at least a portion of time.

7. The method as recited in claim 1, wherein said transmitting with said first sensor electrode while receiving second indicia with said second sensor electrode comprises:
transmitting on a one-at-a-time basis with only said first sensor electrode of said set of sensor electrodes.

8. The method as recited in claim 1, wherein said method for determining capacitance further comprises:
transmitting with one of said at least three sensor electrodes, while receiving with said one of said at least three sensor electrodes.

9. A method for providing a capacitance sensing device, said method comprising:
providing a set of sensor electrodes, said set of sensor electrodes comprising at least three sensor electrodes, wherein a first sensor electrode of said set of sensor electrodes meets a second sensor electrode of said set of sensor electrodes at a first activation region of a plurality of activation regions, wherein said first sensor electrode meets a third sensor electrode of said set of sensor electrodes at a second activation region of said plurality of activation regions, and wherein said second sensor electrode meets said third sensor electrode at a third activation region of said plurality of activation regions;
providing a plurality of sensor channels;
ohmically coupling a first sensor channel of said plurality of sensor channels to said first sensor electrode;
ohmically coupling a second sensor channel of said plurality of sensor channels to said second sensor electrode; and
ohmically coupling a third sensor channel of said plurality of sensor channels to said third sensor electrode, wherein said first sensor channel is configured to both transmit and receive electrical signals, wherein said device is configured such that first indicia for sensing capacitances associated with said plurality of activation regions is received with said first and second sensor channels while said third sensor channel transmits and wherein said device is further configured such that second indicia for sensing capacitances associated with said plurality of activation regions is received with said second sensor channel while said first sensor channel transmits.

10. The method as recited in claim 9, wherein said providing a plurality of sensor channels comprises:
providing said plurality of sensor channels wherein multiple ones of said plurality of sensor channels are each configured to both transmit and receive electrical signals for sensing capacitances associated with multiple activation regions of said plurality of activation regions.

11. The method as recited in claim 9, further comprising:
providing a controller comprising said plurality of sensor channels, said controller configured to transmit on a one-at-a-time basis with sensor channels of said plurality of sensor channels.

12. The method as recited in claim 9, further comprising:
providing a controller comprising said plurality of sensor channels, said controller configured to receive on a one-at-a-time basis with sensor channels of said plurality of sensor channels.

13. The method as recited in claim 9, further comprising:
providing a controller comprising said plurality of sensor channels, said controller configured to receive concurrently with sensor channels of said plurality of sensor channels.

14. The method as recited in claim 9, further comprising:
providing a controller comprising said plurality of sensor channels, said controller configured to transmit with said third sensor channel and to receive concurrently with both said first and said second sensor channels.

15. A capacitive sensing device comprising:
a set of sensor electrodes comprising:
a first sensor electrode of said set of sensor electrodes;
a second sensor electrode of said set of sensor electrodes, wherein said first sensor electrode meets said second sensor electrode at a first activation region of a plurality of activation regions; and
a third sensor electrode of said set of sensor electrodes, wherein said first sensor electrode meets said third sensor electrode at a second activation region of said plurality of activation regions, and wherein said second sensor electrode meets said third sensor electrode at a third activation region of said plurality of activation regions; and
a controller, said controller comprising a plurality of sensor channels, wherein a first sensor channel of said plurality of sensor channels is ohmically coupled to said first sensor electrode, a second sensor channel of said sensor plurality of channels is ohmically coupled to said second sensor electrode, and a third sensor channel of said plurality of sensor channels is ohmically coupled to said third sensor electrode, wherein said first sensor channel is configured to both transmit and receive electrical signals, and wherein the controller is configured such that first indicia for sensing capacitances associated with said plurality of activation regions is received with said first and second sensor channels while said third sensor channel transmits and wherein the controller is further configured such that second indicia for sensing capacitances associated with said plurality of activation regions is received with said second sensor channel while said first sensor channel transmits.

16. The capacitive sensing device of claim 15, wherein at least one of said first, second, and third sensor electrodes comprises a deflectable structure.

17. The capacitive sensing device of claim 15, wherein said plurality of activation regions comprises an activation region defined by an interdigitation of at least two sensor electrodes of said set of sensor electrodes.

18. The capacitive sensing device of claim 15, wherein said plurality of activation regions comprises an activation region defined by a crossing of at least two sensor electrodes of said set of sensor electrodes.

19. The capacitive sensing device of claim 15, wherein said plurality of activation regions is greater in number than said plurality of sensor channels.

20. The capacitive sensing device of claim 15, wherein multiple sensor channels of said plurality of sensor channels are configured to both transmit and receive electrical signals for sensing capacitances associated with said plurality of activation regions.

21. The capacitive sensing device of claim 15, wherein said set of sensor electrodes is arranged in a manner requiring the use of only two conductive layers of said capacitive sensing device.

22. The capacitive sensing device of claim 15, wherein said controller is configured to transmit on a one-at-a-time basis with sensor channels of said plurality of sensor channels.

23. The capacitive sensing device of claim 15, wherein said controller is configured to concurrently receive with multiple sensor channels of said plurality of sensor channels.

* * * * *